(12) United States Patent
Nikoobakht

(10) Patent No.: US 7,968,433 B2
(45) Date of Patent: Jun. 28, 2011

(54) FABRICATION OF NANOWIRES AND NANODEVICES

(75) Inventor: Babak Nikoobakht, Potomac, MD (US)

(73) Assignee: National Institute of Standards and Technology, Gaithersburg, MD (US)

( * ) Notice: Subject to any disclaimer, the term of this patent is extended or adjusted under 35 U.S.C. 154(b) by 281 days.

(21) Appl. No.: 12/247,617

(22) Filed: Oct. 8, 2008

(65) Prior Publication Data

US 2009/0124053 A1    May 14, 2009

Related U.S. Application Data

(60) Provisional application No. 61/042,237, filed on Apr. 3, 2008.

(51) Int. Cl.
*H01L 21/20* (2006.01)
(52) U.S. Cl. .............. 438/478; 257/E21.132; 977/890
(58) Field of Classification Search ........... 257/E29.245, 257/E21.131, E21.132, E21.461, E21.463–E21.465; 438/197, 478; 977/938, 890, 891, 892
See application file for complete search history.

(56) References Cited

U.S. PATENT DOCUMENTS

| | | | | |
|---|---|---|---|---|
| 6,022,813 | A * | 2/2000 | Kobayashi et al. | 438/778 |
| 7,064,372 | B2 * | 6/2006 | Duan et al. | 257/296 |
| 7,678,672 | B2 * | 3/2010 | Gambin et al. | 438/478 |
| 2006/0060857 | A1 * | 3/2006 | Mardilovich et al. | 257/66 |
| 2007/0221840 | A1 | 9/2007 | Cohen et al. | |
| 2008/0173971 | A1 | 7/2008 | Sharma et al. | |

OTHER PUBLICATIONS

Nikoobakht, B., et al. "Horizontal growth and in situ assembly of oriented zinc oxide nanowires." Applied Physics Letters, vol. 85 No. 15, 3244-3246 (2004).*
Sun, S., et al. "Fabrication of gold micro- and nanostructures by photolithographic exposure of thiol-stabilized gold nanoparticles" Nano Letters, vol. 6, No. 3, 345-350 (2006).*
Chen et al., Self-assembled growth of epitaxial erbium disilicide nanowires on silicon (001), Applied Physics Letters, vol. 76, No. 26, 4004-4006 (2000).
D. Doppalapudi, Epitaxial growth of gallium nitride thin films on A-plane sapphire by molecular beam epitaxy, J. of Applied Physics, vol. 85, No. 7, 3582-89 (1999).
P. Fons, Uniaxial locked epitaxy of ZnO on the a face of sapphire, Applied Physics Letters, vol. 77, No. 12, 1801-1803 (2000).
E. Fortunato, Wide-bandgap high-mobility ZnO thin-film transistors produced at room temperature, Applied Physics Letters, vol. 85, No. 13, 2541-2543 (2004).
Michael H. Huang, et al., Room-Temperature Ultraviolet Nanowire Nanolasers, www.sciencemag.org, Science, vol. 292, 1897-1899 (2001).
Yu Huang, Directed Assembly of One-Dimensional Nanostructures into Functional Networks, Science, vol. 291, 630-633, www.sciencemag.org (2001).
R. Martel, et al., Single- and multi-wall carbon nanotube field-effect transistors, Applied Physics Letters, vol. 73, No. 17, 2447-2449 (1998).
Nicholas A. Melosh, et al., Ultrahigh-Density Nanowire Lattices and Circuits, Science 300, 112-115 (2003).
G. Nandipati et al., Effects of strain on island morphology and size distribution in irreversible submonolayer growth, Physical Review B, 73, 045409-1 to 6 (2006).
Babak Nikoobakht et al, Horizontal growth and in situ assembly of oriented zinc oxide nanowires, Applied Physics Letters, vol. 85, No. 15, 3244-3246 (2004).

(Continued)

*Primary Examiner* — Matthew Smith
*Assistant Examiner* — Daniel Shook
(74) *Attorney, Agent, or Firm* — Berenato & White, LLC

(57) ABSTRACT

Methods of fabricating nanowire structures and nanodevices are provided. The methods involve photolithographically depositing a nucleation center on a crystalline surface of a substrate, generating a nanoscale seed from the nucleation center, and epitaxially growing a nanowire across at least a portion of the crystalline surface starting at a nucleation site where the nanoscale seed is located.

20 Claims, 8 Drawing Sheets

OTHER PUBLICATIONS

B. Nikoobakht, Toward Industrial-Scale Fabrication of Nanowire-Based Devices, Chem. Mater. 19, 5279-5284 (Oct. 9, 2007).

Regina Ragan, et al., Ordered arrays of rare-earth silicide nanowires on Si(0 0 1), Journal of Crystal Growth 251, 657-661 (2003).

Peter A. Smith, Electric-field assisted assembly and alignment of metallic nanowires, Applied Physics Letters, vol. 77, No. 9, 1399-1401 (2000).

R.S. Wagner, et al., Study of the Filamentary Growth of Silicon Crystals from Vapor, Journal of Applied Physics, vol. 35, No. 10, 2993-3000 (1964).

Xudong Wang, et al., Direct-Current Nanogenerator Driven by Ultrasonic Waves, www.sciencemag.org, Science, vol. 316, 102-105 (Apr. 6, 2007).

Bin Xiang et al, Rational Synthesis of p-Type Zinc Oxide Nanowire Arrays Using Simple Chemical Vapor Deposition, Nano Letters, vol. 7, No. 2, 323-328 (Dec. 29, 2006).

Yu, et al., Large-area blown bubble films of aligned nanowires and carbon nanotubes, Nature nanotechnology, vol. 2, 372-77, www.nature.com/naturenanotechnology (Jun. 2007).

Son Jin, et al., Scalable Interconnection and Integration of Nanowire Devices without Registration, NanoLetters, vol. 4, No. 5, 915-919 (2004).

F. Kim, et al., Langmuir-Blodgett Nanorod Assembly, J. Am. Chem. Soc., vol. 123, 4360-4361 (2001).

* cited by examiner

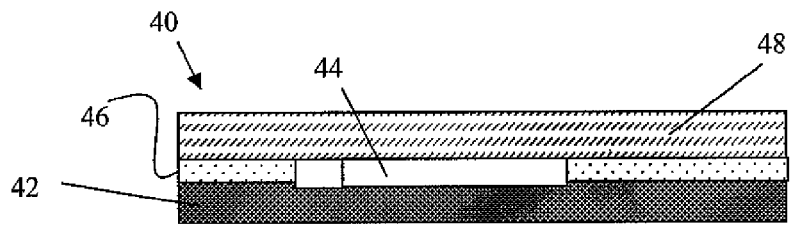
Fig. 5
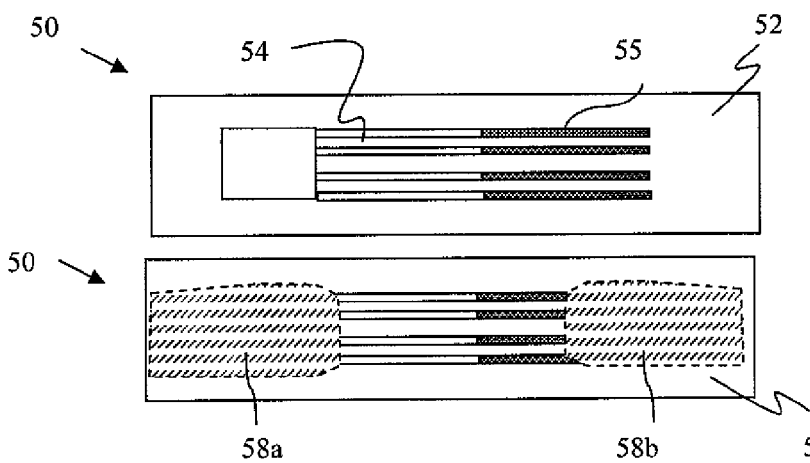
Fig. 6A
Fig. 6B
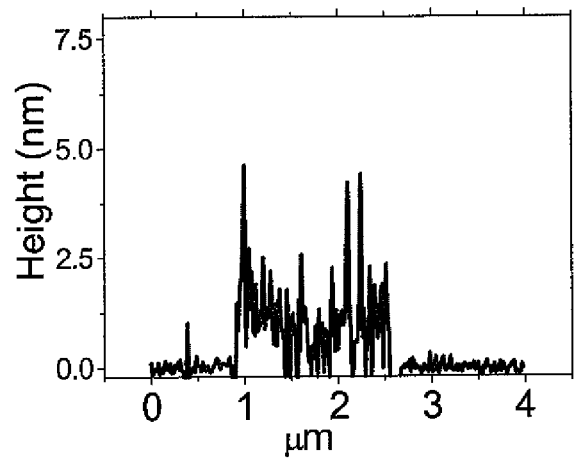
Fig. 7

FABRICATION OF NANOWIRES AND NANODEVICES

CROSS-REFERENCE TO RELATED PATENT APPLICATIONS

This application claims the benefit of priority of provisional application 61/042,237 filed in the U.S. Patent & Trademark Office on Apr. 3, 2008, the complete disclosure of which is incorporated herein by reference.

ORIGIN OF THE INVENTION

The invention described herein was made by an employee of the United States Government. The United States Government has an ownership interest in this invention.

FIELD OF THE INVENTION

The present invention relates to nanocomponents and nanodevices, especially nanowires and nanowire-containing nanodevices, and to methods of fabricating and using the same.

BACKGROUND OF THE INVENTION

Since the emergence of nanostructures as technologically relevant materials, "bottom-up" fabrication strategies and directed assembly methods have become increasingly attractive. Due to their potential for proliferating a new generation of electronic devices, the need for the development of nanostructures has been noted in the International Technology Roadmap for Semiconductors.

In the current state-of-the-art "bottom-up" assembly of nanodevices, that is, devices containing nano-scale components such as nanowires, multi-step preparatory routines involving the formation, transfer, and alignment of nanowires are typically practiced. Specifically, in such routines nanowires are grown on a primary substrate, then removed from the substrate and transferred to a solution. The nanowires are then transferred from the solution to a secondary substrate, where an alignment technique is employed to align the nanowires with one another. Several techniques for aligning nanowires and controlling nanowire hierarchy have been developed. These techniques include electric field assisted orientation and alignment with fluid flow in microchannels. More recent advances have involved the confinement and alignment of nanowires using the Langmuir-Blodgett technique, assembly of densely packed elongated metal nanowires using a pattern transfer process, microcontact printing, and large-area blown bubble films of aligned nanowires.

These multi-step growth and alignment techniques are lacking in their capability to accurately and repeatedly position nanowires at predetermined coordinates on a substrate. The capability of accurately and repeatedly positioning nanowires at selected coordinates is critical for nanofabrication at technologically relevant scales, in particular for facilitating the subsequent processing steps which involve integration of nanowires with micro-scale and nano-scale components.

SUMMARY OF THE INVENTION

In accordance with the purposes of the invention as embodied and broadly described herein, a first aspect of the invention provides a method of fabricating a nanowire structure. The method features photolithographically depositing a nucleation center on a crystalline surface of a substrate, generating a nanoscale seed from the nucleation center, and epitaxially growing a nanowire across at least a portion of the crystalline surface starting at a nucleation site where the nanoscale seed is located.

A second aspect of the invention provides a method of fabricating a nanodevice, in which a nucleation center is photolithographically deposited on a crystalline surface of a substrate, a nanoscale seed is generated from the nucleation center, and a nanowire is epitaxially grown across at least a portion of the crystalline surface starting at a nucleation site where the nanoscale seed is located. First and second components are applied to first and second portions of the nanowire, the first and second components being spaced apart from one another and connected by the nanowire.

A third aspect of the invention provides a method of fabricating a nanodevice. The method of this aspect features photolithographically depositing a nucleation center on a crystalline surface of a substrate, generating a nanoscale seed from the nucleation center, epitaxially growing a nanowire across at least a portion of the crystalline surface starting at a nucleation site where the nanoscale seed is located, applying a first component on a first portion of the nanowire, applying a second component on a second portion of the nanowire spaced apart from and connected to the first portion, applying an insulation layer on the first and second components and the nanowire, and applying a gate electrode on the insulation layer.

Other aspects of the invention, including apparatus, systems, methods, and the like which constitute part of the invention, will become more apparent upon reading the following detailed description of the exemplary embodiments and viewing the drawings.

BRIEF DESCRIPTION OF THE DRAWINGS

The accompanying drawings are incorporated in and constitute a part of the specification. The drawings, together with the general description given above and the detailed description of the exemplary embodiments and methods given below, serve to explain the principles of the invention. In such drawings:

FIG. 5 is a cross-sectional view of a nanodevice prepared according to another exemplary embodiment of the invention;

FIGS. 6A and 6B represent overhead views of a nanodevice according to another exemplary embodiment of the invention during different stages of production;

FIG. 7 is an AFM graph of a photolithographically deposited nucleation center (pad) after photoresist lift-off.

DETAILED DESCRIPTION OF EXEMPLARY EMBODIMENTS OF THE INVENTION

Figure 1:
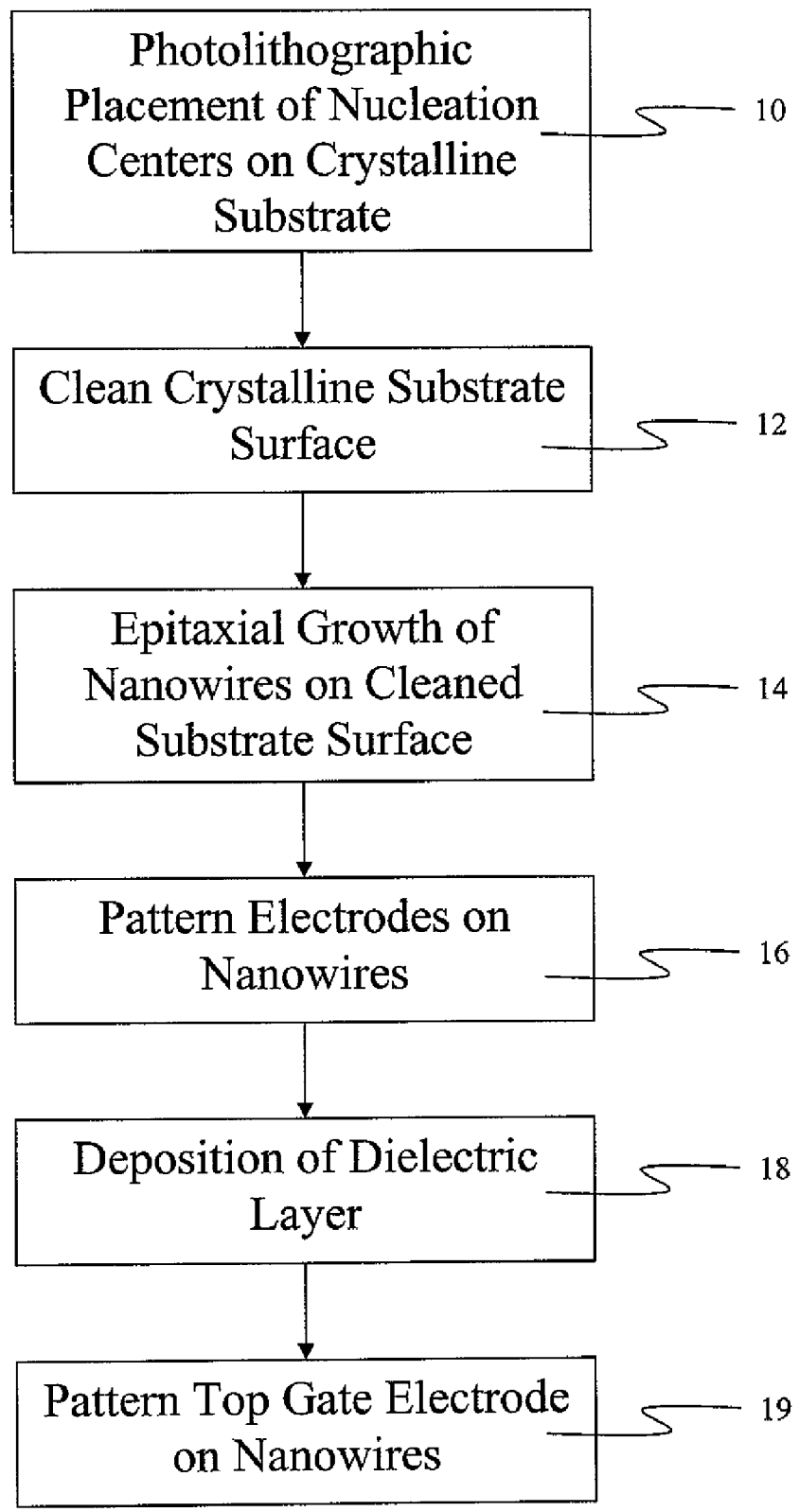
FIG. 1 is a flow chart of a fabrication process for carrying out an exemplary embodiment of the present invention.

Reference will now be made in detail to exemplary embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in this section in connection with the exemplary embodiments and methods. The invention according to its various aspects is particularly pointed out and distinctly claimed in the attached claims read in view of this specification, and appropriate equivalents.

It is to be noted that, as used in the specification and the appended claims, the singular forms "a," "an," and "the" include plural referents unless the context clearly dictates otherwise.

FIG. 1 depicts a flowchart setting forth steps for integrating nanowires into a nanodevice in an exemplary photolithography process designed to permit selection and implementation of precise starting coordinates for the "horizontal" growth of nanowires.

In step 10 of FIG. 1, photolithography is practiced to selectively deposit nucleation centers on the surface of a substrate 20. Photolithography techniques known in the art can be practiced in the context of these exemplary embodiments to position the nucleation centers at precise coordinates (locations) on a substrate. These coordinates are typically predetermined and are based on a preconceived architecture of the nanodevice and in particular the coordinates of the nanowires in the architecture. Fiduciary (global) markers can also be deposited in this photolithography step 10 to provide reference points on the substrate. These reference points may assist in, for example, in identifying and distinguishing nanowires and for facilitating the subsequent application of electronic equipment on the substrate.

Figure 2A:
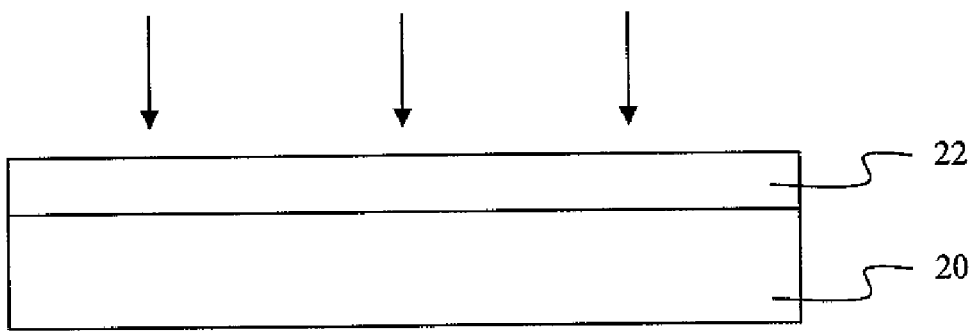
FIGS. 2A-2D are schematic side sectional views showing a progression of photolithography steps according to an exemplary embodiment of the invention for depositing nucleation centers on a substrate at predetermined locations (coordinates)
Figure 2B:
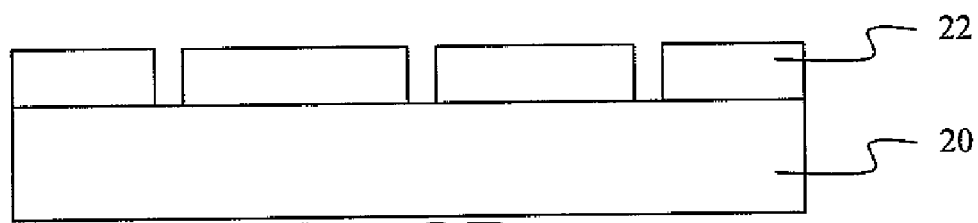
Figure 2C:
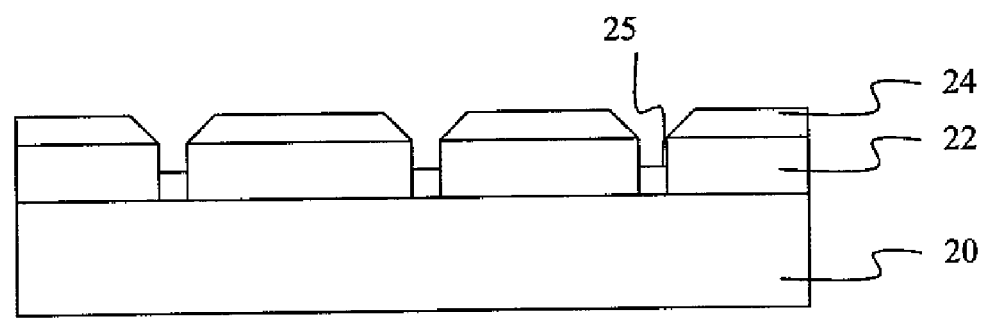
Figure 2D:
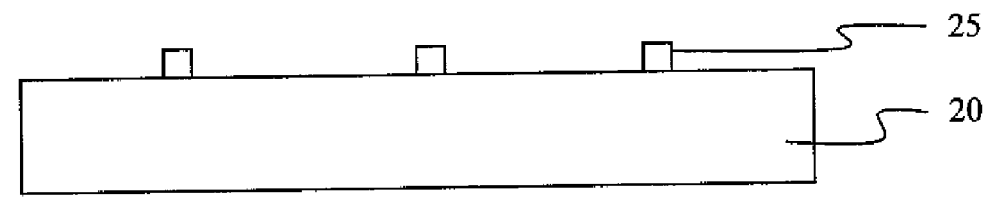

FIGS. 2A-2D illustrate an embodiment for carrying out photolithography step 10 of FIG. 1. In FIG. 2A, a photoresist 22 deposited on the substrate 20 is subjected to ultraviolet (UV) light exposure at regions corresponding to the desired coordinates of nucleation centers on the substrate 20. The photoresist 22 is then processed to remove the regions of the photoresist 22 which have been exposed to the UV light. The removal of the exposed photoresist regions creates windows through the photoresist 22 that reveal surface areas of the substrate 20, as shown in FIG. 2B. In FIG. 2C, a nucleation material is deposited to establish a layer 24 over the photoresist 22. Portions of the nucleation material deposited over the windows penetrate through the photoresist 22 and deposit directly on the surface of the substrate 20. The nucleation material deposited on the substrate surface form nucleation centers 25 or pads. The photoresist 22 and portions of the layer 24 of nucleation material resting on the photoresist 22 are then removed, leaving only the nucleation centers 25 on the substrate 20 at selected coordinates, as shown in FIG. 2D.

In certain examples described below the substrate 20 is composed of sapphire polished along its α-plane ($11\bar{2}0$). It should be understood that other facets of sapphire such as R-plane or other crystalline substrate materials may be selected and used in lieu of or in combination with sapphire. Representative crystalline substrate materials that may be suitable for use in connection with the invention include silicon, silicon carbide, and gallium nitride. This list is not intended to be exhaustive. Combinations of crystalline and non-crystalline materials may be used. For example, the substrate 20 may comprise a non-crystalline base carrying a crystalline (e.g., sapphire) surface layer.

The nucleation centers 25 shown in FIG. 2D are selected from materials capable of forming nano-nucleation seeds 27 (FIG. 3B), typically nanodroplets (also referred to as nanoparticles) for promoting the growth of the nanowires. In certain examples described below gold is selected as the nucleation material. Other nucleation materials such as silver or copper may be used. This list is meant to be illustrative, and not exhaustive of the possible nucleation materials that may be selected.

Figure 3A:
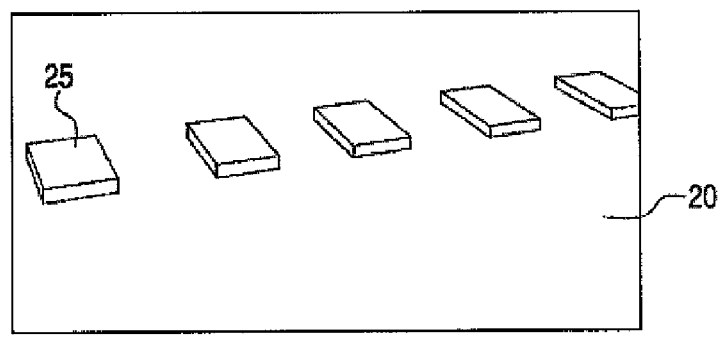
FIG. 3A is a perspective view of a conceptual drawing of nucleation centers (appearing as pads) deposited on a substrate using photolithography.

FIG. 3A illustrates a perspective view of a conceptual drawing of nucleation centers 25 deposited on a substrate using photolithography. The nucleation centers 25 appear as pads having a generally rectangular shape with a uniform height (or thickness). The width and length of the nucleation centers are not particularly limited and can be, for example, 10 nm to 10 microns in one or both dimensions. In this exemplary embodiment the thickness (height) of the pads is preferably less than about 25 nm. As discussed below in connection with FIG. 7, in practice the thickness of the nucleation centers is typically non-uniform. It is believed that relatively low pad thickness promotes the subsequent epitaxial growth of the nanowires in a horizontal direction. The term "horizontal" is used herein in reference to the substrate surface, that is, to denote extension of the nanowire parallel to and across at least a portion of the substrate surface.

The photolithography step 10 permits deposition of the nucleation centers 25 at predefined coordinates in a precise and highly reproducible manner. Additionally, nucleation centers 25 of different widths and lengths can be deposited. Precise control over the deposition coordinates and the dimensions of the nucleation centers 25 provides reproducibility and flexibility advantages that make the technology particularly attractive for industrial-scale implementation of a wide array of nanodevices.

After photolithographic deposition of the nucleation centers 25 and optional fiduciary markers, the substrate 20 is subjected to a cleaning step 12 (FIG. 1) to remove contaminants, especially organic contaminants. Effective cleaning of the surface of the substrate 20 promotes subsequent horizontal growth of nanowires directly on the substrate 20 surface, as discussed below in connection with step 14. Techniques such as ozone cleaning (UV light) and/or conventional solvents such as acetone and/or methylene chloride $CH_2Cl_2$ may be used. Particularly in the case of sapphire, ozone cleaning creates an oxygen-rich ($11\bar{2}0$) substrate surface which exhibits enhanced lattice matching with hexagonal-type crystal semiconductor materials such as zinc oxide.

Next, in step 14 of FIG. 1, nanowires (also known in the art as nanorods) are grown epitaxially on the substrate 20, commencing at nucleation centers 25 and extending "horizontally" along the substrate 20 surface. Conditions and practices conducive to growth of nanowires, albeit vertical growth, are described in Yazawa, et al., *Appl. Phys. Lett.*, 1991, 58, 1080; Huang, et al., Science 2001, 292, 1897; and Jin et al., Nano Lett. 2004, 4, 915, the disclosures of which are incorporated herein by reference. The conditions and practices of these publications can be integrated into the methods described herein to cause horizontal growth of nanowires.

For the purposes of discussion, in the examples detailed below gold nucleation centers are used to initiate horizontal growth of zinc oxide (ZnO) nanowires on α-plane (11$\bar{2}$0) sapphire. Zinc oxide was selected because of its multiple uses, e.g., as a sensor, piezoelectric, UV light emitter and transparent semiconductor in the visible spectrum. Zinc oxide is one of the best materials for opto-electronic devices such as UV LEDs and laser diodes, particularly in view of its band gap of 3.36 eV and large exciton binding energy of 60 meV. It should be understood that materials other than zinc oxide may be selected for growing the nanowire, including those having hexagonal-type crystal lattices. Nanowire materials having alternative crystal-type lattices may be used, in which case the substrate should be selected and prepared to optimize their lattice match. Examples of other nanowires materials include various semiconductor materials, gallium nitride, titanium oxide ($Ti_xO_y$), etc.

Figure 3B:
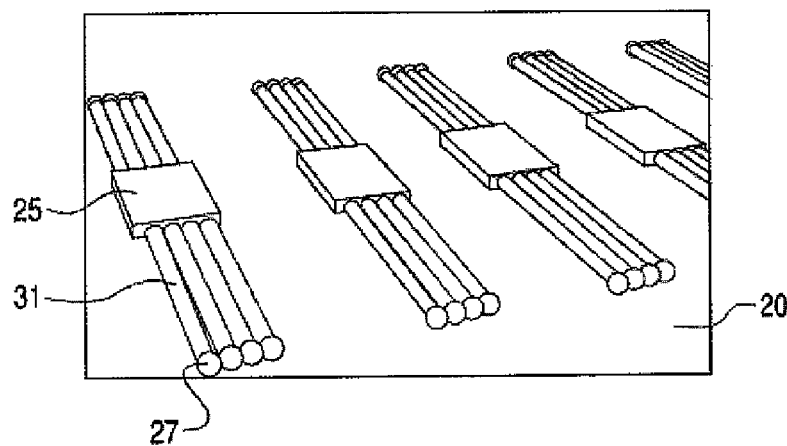
FIG. 3B is a perspective view of a conceptual drawing of nanowires grown on the substrate starting at opposite ends of the nucleation centers.

The (gold) nucleation centers 25 are subject to treatment, typically heat of sufficiently high temperature to cause the nucleation centers 25 to generated liquid nanoseeds (nanodroplets or nanoparticles) 27 (FIG. 3B). Nanowires 31 are epitaxially grown directly on the surface of the substrate 20 via a phase transport process in which the nanodroplets 27 at one or both ends of the nucleation centers 25 serve as nucleation sites for the nanowire growth. By way of explanation and not necessary limitation, in the examples below in which the nucleation centers 25 are gold and the nanowires 31 are zinc oxide, it is believed that the nanowire growth starts at the initial nanodroplet location (that is nucleation site) and continues along the [1$\bar{1}$00]$_{sap}$ of sapphire as the nanodroplet 27 migrates/moves on the surface of the substrate 20. The localized and confined growth of zinc oxide nanowires is achieved using gold nanodroplets as "mobile crystal growers" which are advanced across the substrate surface by the growing nanowires 31.

In-plane and oriented growth of small diameter nanowires occurs on the α-plane of the sapphire substrate. Growth direction is controlled by a lattice match between zinc oxide and the underlying substrate. See generally *Epitaxial Growth of gallium nitride thin films on A-plane sapphire by molecular beam epitaxy*, D. Doppalapudi, et al., J. of Applied Physics, 85, 7, 3582-3589 (1999). Specifically, the zinc oxide (c-plane) and sapphire (α-plane) have a close lattice match along their "a" ("α") and "c" axes, respectively. FIG. 3B is a perspective view of a conceptual drawing of nanowires 31 epitaxially grown across the surface of a sapphire substrate 20. Growth of the nanowires 31 begins at both of the opposite ends of the nucleation center (pad) 25 in FIG. 3B. The nanowires 31 at each end of the pad 25 extend substantially linearly and substantially parallel to one another. The direction and linearity (or lack thereof) of the nanowires 31 will be dictated by the lattice structure of the selected substrate.

A single nanowire or multiple nanowires 31 may be grown from one or both ends of a given nucleation center 25. A direct correlation exists between the furnace temperature and the average size of the nanodroplets formed at a nucleation center 25. The temperature at which the nanodroplets form will vary depending upon the nucleation material selected. Usually for gold as the nucleation material, a temperature range of 750° C. to 1200° C., results in the growth of horizontal ZnO nanowires. The minimum temperature that Zn and O precursors enter the vapor phase is about 750° C., and could be reduced to 400° C.-500° C., for example, by using organometallic species such as diethyl zinc and oxygen. The formation of single nanowires and small pluralities of nanowires can also be attained by increasing the resolution of the photolithography to provide narrower nucleation centers. In devices with higher multiplicities of nanowires, the nanowires will typically be characterized by smaller diameters and larger surface areas. These devices are expected to be more suitable for sensing applications as compared to thicker (e.g., 100 nm diameter) single nanowire devices. If desired, relatively long nanowires can be grown using this method, such as, for example 10 microns or longer, or even 50 microns or longer. The nanowires may be grown to relative long (or short) lengths by increasing (or decreasing) the furnace epitaxial growth time, and by controlling the amount of nanowire precursor material introduced into the furnace.

Figure 3C:
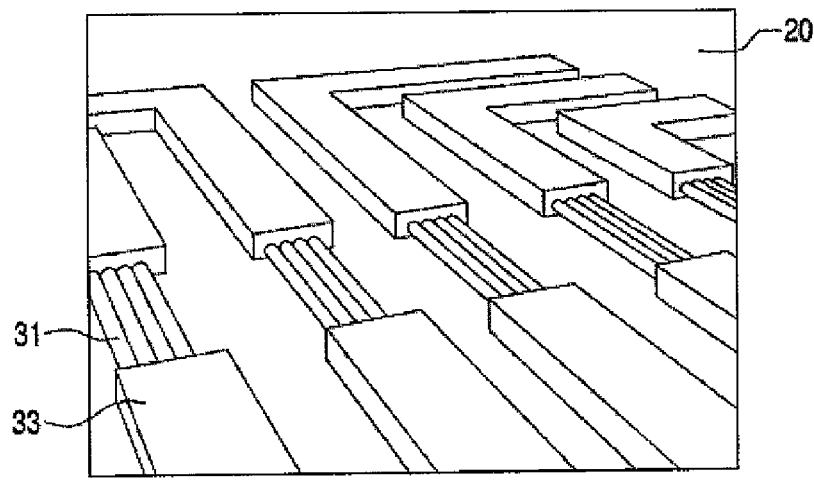
FIG. 3C is a perspective view of a conceptual drawing of electrodes applied to the nanowires of FIG. 3B.
Figure 4A:
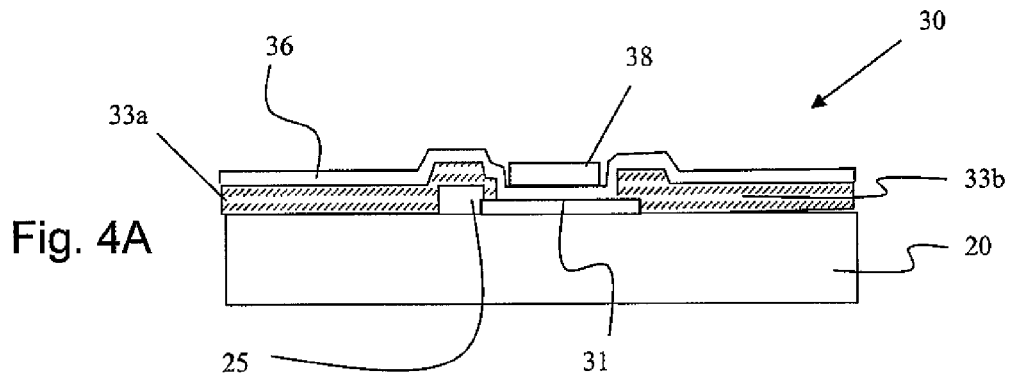
FIG. 4A is a cross sectional view of a field effect transistor (FET) prepared according to an exemplary embodiment of the invention.
Figure 4B:
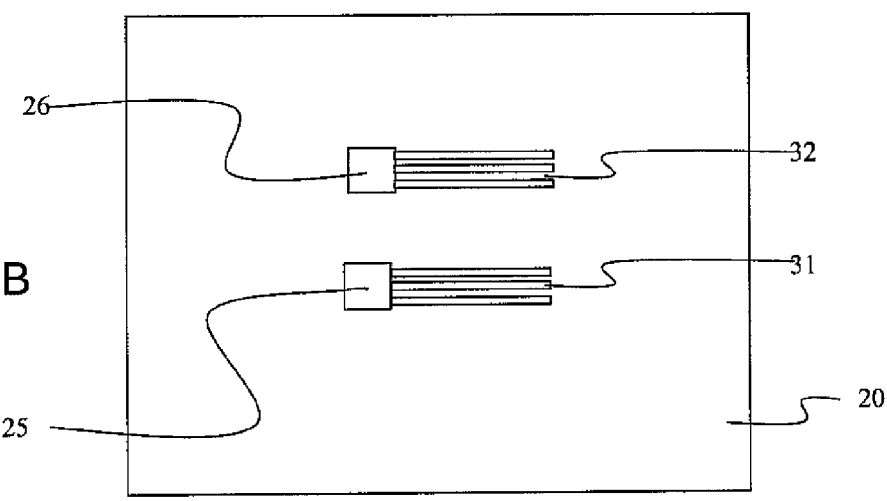
FIGS. 4B and 4C represent overhead views of the FET of FIG. 4A during different stages of production.
Figure 4C:
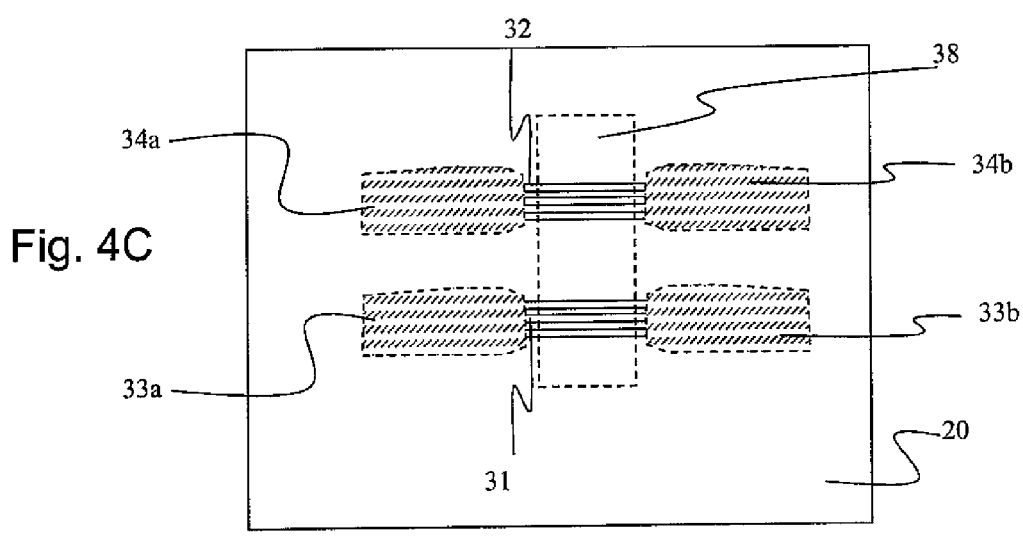

In a photolithography step 16 (FIG. 1), patterns of metal electrodes are placed on the nanowires. FIG. 3C is a perspective view of a conceptual drawing of metal electrode patterns 33 deposited on nanowires. A field effect transistor (FET) prepared according to an embodiment of the invention is generally designated by reference numeral 30 in FIG. 4A. The substrate 20 and nucleation centers 25, 26 may be selected and prepared as described, for example, above with reference to FIGS. 2A-2D. As shown in FIG. 4B, a first set of nanowires 31 is epitaxially grown from both ends of the nucleation center 25, and a second set of nanowires 32 is epitaxially grown from one of the ends of the other nucleation center 26. This is followed by placing the metal contacts 33 and 34 with preset gaps on the two ends of nanowires. A silicon oxide or a dielectric layer with a thickness of, for example, 10 to 100 nm is deposited in step 18. In a subsequent photolithography step 19, a top gate electrode pattern (38 in FIG. 4A) is placed on the nanowires to fabricate field effect transistors (FETs).

In another embodiment shown in FIG. 5, a nanodevice 40 design especially suitable for an light emitting diode (LED) includes one or more n-type horizontal nanowire(s) 44 such as ZnO grown on a p-type substrate 42 such as GaN. Since the growth is epitaxial, the nanowire(s) 44 are in fall contact with the GaN surface of the substrate 42. The heights of nanowires. 44 are between, for example, 50 nm to 100 nm. After the growth of the n-type nanowire(s) 44, a thin layer of silicon oxide 46 is spin coated on the entire substrate 42. "Spin-on glass" silicon oxide is an appropriate coating for this purpose, because after spin coating, the surface is completely flat. This surface is etched using known wet or dry etching processes such as reactive ion etching (RIE) until the top surface of the horizontal nanowire(s) 44 become exposed. At this point, an appropriate metal coating 48 such as Ti/Au is used to make an ohmic contact with the nanowire(s) 44. The silicon oxide layer 46 serves as a dielectric between the metal electrode 48 and the p-type substrate 42.

The as-grown zinc oxide nanowires on α-plane sapphire are n-type materials. The nanowires may be converted in whole or in part to a p-type material by including an appropriate dopant in the tube furnace during growth of the nanowire. Examples of suitable dopants are phosphorus pentoxide or ammonium gas. Doping can be controlled to create a pn junction, i.e., a p-type portion and an n-type portion of the nanowire. The pn-junction may be formed, for example, by interrupting the growth of a n-type nanowire, for example, by introducing the p-type dopant into the tube furnace at an appropriate stage, e.g., after the n-type portion of the nanowire has grown. Growth is then continued in the furnace as the p-type dopant is incorporated into the remaining portion of the nanowire grown after introduction of the dopant. FIGS. 6A and 6B illustrate a nanodevice 50, such as a LED, having nanowires each with an n-type nanowire portion 54 and a p-type nanowire portion 55 epitaxially grown on α-plane sapphire substrate 52. At this point, as shown in FIG. 6B, metal electrodes 58a and 58b are applied respectively on the opposite n-type portion 54 and p-type portion 55 ends of the nanowires to make ohmic contacts with the nanowires. Ti/Au and Ni/Au are examples of metal electrode materials that may be formed on the n-type nanowire portion 54 and the p-type nanowire portion 55, respectively.

The fabrication route described in connection with certain exemplary embodiments of the invention employs a "bottom-up" chemical approach that exceeds the current state-of-the-art assembly of nanowire-based devices and may result in one or more of the following important advances to the field. First, by precisely growing horizontal nanowires at selected starting coordinates in a predetermined growth direction, the end point coordinates of nanowires become known and reproducibly implemented. Therefore, devices may be fabricated exactly where horizontal nanowires are residing. Second, in exemplary embodiments the method allows control over the number of nanowires in each device. Each nanowire is grown from a nucleation site (e.g., gold nanodroplet). Controlling the number and size of the nucleation sites permits control over the number density of the nanowires. Third, the fabrication method as embodied in exemplary embodiments described herein is scalable to permit industrial implementation in its current status. Fourth, the method may be practiced as a parallel nanofabrication process in which nanowires are epitaxially grown substantially simultaneously, rather than requiring serial (consecutive) device fabrication using high resolution lithography methods such as electron beam lithography (EBL).

A multitude of experimental and industrial applications are possible using this technique. Considering the current advances in semiconductor industry for feature miniaturization, the technique is suited for producing new generations of nanodevices with densities comparable to current technology. In the field of crystal growth, use of "mobile metal nanodroplets" such as gold, may allow planar and localized growth of nanocrystals and their heterostructures. This approach can be extended to other (e.g., II-VI or III-V) semiconductor nanowires that have lattice matching with their underlying substrate. This technique in combination with other nanofabrication methods is expected to be used as a platform for building more complex architectures. Furthermore, it may be used as a template for reproducible growth and direct assembly of other important metallic or semiconductor nanostructures which cannot be prepared otherwise. This method, due to its scalability and ease of device fabrication, is believed to present an attractive approach for mass fabrication of nanowire-based transistors and sensors and has the potential to impact nanotechnology in fabrication of non-conventional nanodevices.

EXAMPLES

The following examples are provided for the purpose of further explanation of exemplary embodiments of the invention, and are not to be construed of exhaustive or necessarily limiting of the scope of the invention.

1. Procedure

For patterning a sapphire surface with gold, 8 mm×8 mm α-plane sapphire pieces were washed with small cotton swabs and deionized (DI) water and then nitrogen (99.99%) dried. Following these photolithography preparation protocols, samples were coated with photoresist. For the purpose of these examples, the photoresist was Shipley 1318, which was spin coated at 5 seconds at a spinning speed of 400 rpm, followed by 45 seconds at 4000 rpm. The photoresist was baked for 1 minute at 115° C., then selectively exposed to ultraviolet light. The photoresist was immersed in chlorobenzene for 4 minutes for surface hardening, then nitrogen gas dried. The photoresist was then developed in MF-319 or MF-CD 26 (water and tetramethyl-ammonium hydroxide), submerged in deionized water for a few minutes, then nitrogen gas dried.

Patterns of 1 µm×5 µm gold pads along with fiduciary markers of gold were created on the photoresist as follows. Thin gold films, 1 to 3 nm, were deposited on photoresist using a thermal evaporator. Photoresist lift-off was carried out in acetone for at least 45 minutes. According to one protocol, lift-off was performed by submerging in acetone or methylene chloride at 50° C. for 2 hours. After 3 minutes of ozone cleaning, the washed and dried substrate was transferred to the end of a small quartz tube for nanotube fabrication.

The long sides of the deposited gold nucleation centers/pads (and fiduciary markers) were parallel to the $[1\bar{1}00]_{sap}$ direction of the sapphire wafer. From an atomic force microscopy (AFM) line profile of a gold pad shown in FIG. 7, an average height value of 2.5 nm for gold pad thickness was determined.

Zinc oxide nanowires were grown via a phase transport process using gold nanodroplets as nucleation sites. For gold nanodroplets less than 25 nm in size, in-plane and oriented growth of small diameter nanowires was observed on the α-plane sapphire. ZnO/graphite mixture (0.15 g, 1:1 mass ratio) was loaded on a silicon substrate and positioned at the center of an inner tube (13 cm length, 1.9 cm inner diameter). The tube with its sapphire substrate and contents was inserted into a tube furnace such that the mixed powder was placed at the center of an outer tube (80 cm length, 4.9 cm inner diameter). The tube furnace temperature was set at 900° C. (with a ramp rate of 110° C./min) for 10 minutes under 0.6 standard liters per minute (SLPM) flow of 99.99% argon gas. The argon gas flow transports the Zn/O atoms to the gold nucleation center where crystal growth takes place.

The furnace heat generated gold nanodroplets on the surface and edges of the nucleation centers (pads). The nanodroplets residing at the two short ends of each gold pad produced densely packed horizontal zinc oxide nanowires. The AFM height profile of these nanowires showed nanowire diameters ranging from 8 nm to 13 nm. Typically gold pads with 3 (±1) nm thickness (height) resulted in nanowires with an average thickness of 11 (±3) nm and the nanowire density per pad width was found to be about 10 nanowires per µm. This number can be further reduced by decreasing the number of gold nanodroplets, for example by lowering temperature, or by increasing the resolution of the optical lithography to provide narrower nucleation centers. Horizontal nanowires epitaxially grown on sapphire are not readily removed from the substrate surface. Based on SEM and AFM size measurements, width-to-height ratio of the nanowires was typically found to be between about 1:1 to about 2:1; therefore, a cross-sectional/end profile ranging from semicircular to bottom-truncated circular was assumed for the horizontal nanowires.

In the next step of photolithography, using the fiduciary markers already on the surface (from steps described above), integration of nanowires and metal electrodes into devices was carried out by aligning the markers with complementary ones on a photolithography mask. Metal electrode patterns were placed on nanowires across the whole 8 mm×8 mm substrate with a good precision that was limited to the resolution of the mask aligner. Alignment of nanowires and electrodes was performed such that the left metal contact resided at the beginning of nanowires. Depending on the number of grown nanowires from a given gold pad, a nanodevice was comprised of single or multiple nanowires.

In the developed example, parallel fabrication of nanodevices was achieved using a photolithography process with one micron feature resolution. This is in contrast to the current state-of-the-art nanowire-device fabrication in which registries of nanowires are not known and single nanowire devices are typically fabricated randomly by EBL in a serial fashion. By increasing the resolution of the optical lithography, even better control over the number of nanowires is expected.

2. Results and Discussion

Electrical transport measurements presented here were carried out on three different batches of chips. In a single fabrication process, more than 600 nanodevices can be prepared composed of both single and multi nanowire devices. More than 20 nanodevices from the aforementioned batches were tested repeatedly over the course of 3 months. During this period none of the nanodevices showed any evidence of degradation or aging. The nanowire FET devices were fabricated by first depositing a 60 nm thick silicon oxide layer on the entire substrate using a plasma enhanced chemical vapor deposition technique. Subsequently, gate electrodes were placed on their exact locations via a third step of photolithography. In the devices studied, the nanowires as well as part of the source-drain electrodes were covered by the gate electrode. All reported electrical transport measurements of single nanowires or groups of nanowires were measured at room temperature and ambient pressure. In the studied nanowire devices, the number of nanowires ranged from 1 to 8.

Figure 8A:
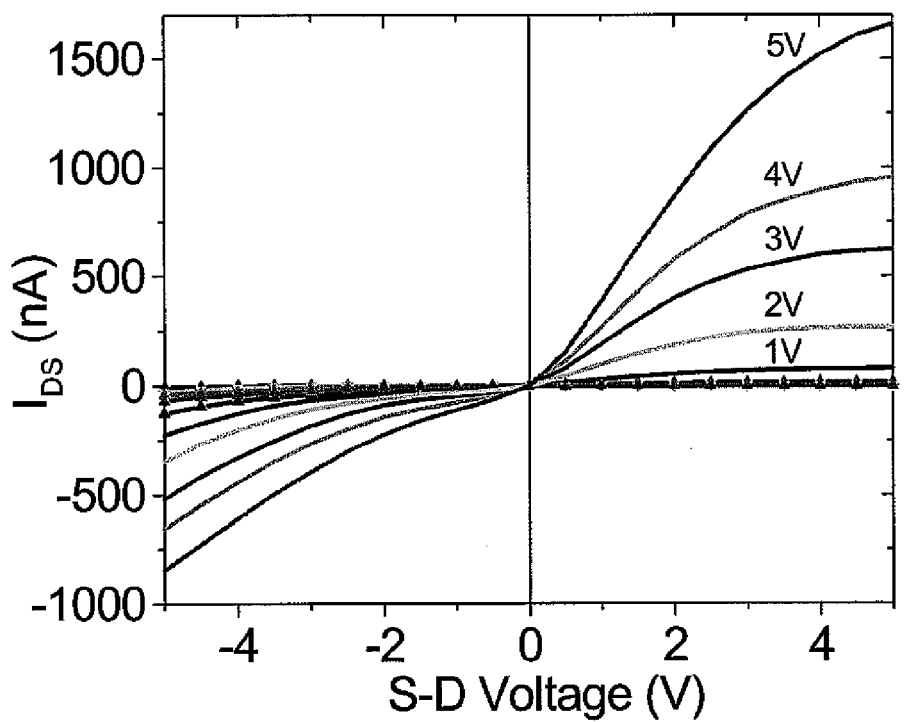
FIGS. 8A-8F are current-voltage and transconductance measurements of nanowire-containing devices.
Figure 8B:
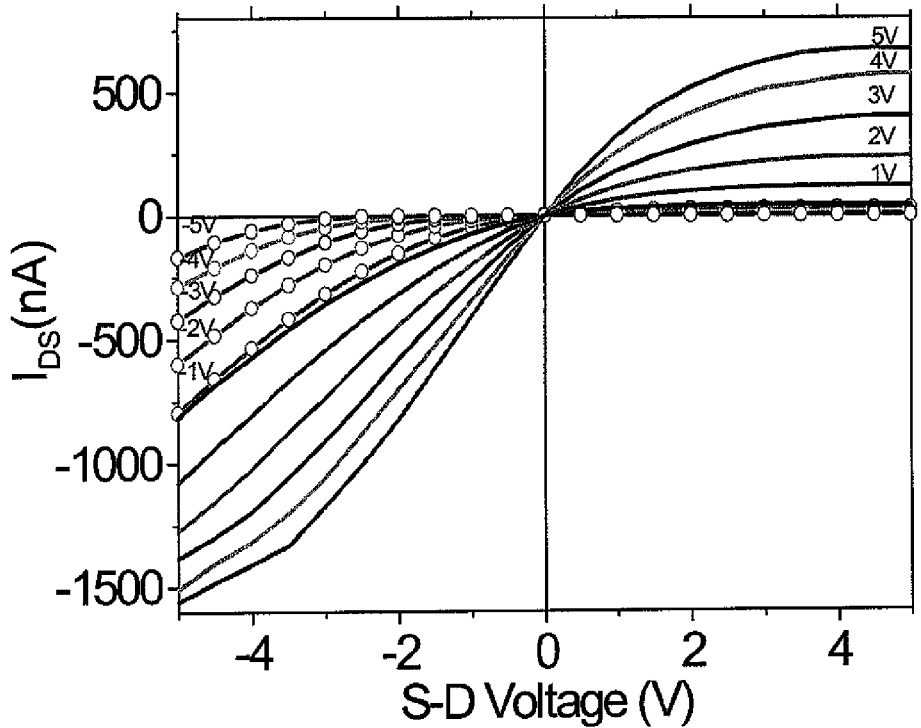
Figure 8C:
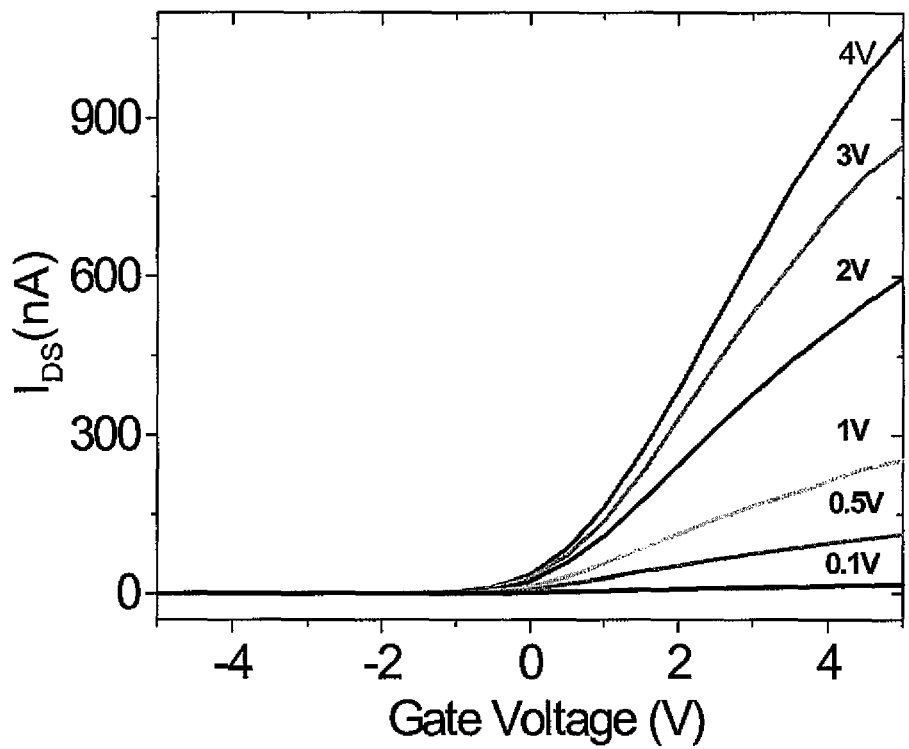

Typical current vs. source-drain voltage ($I_{DS}$-$V_{DS}$) scans are shown in FIGS. 5A and 8B. The nanowire device of FIG. 8A was a top-gated FET nanowire device containing eight nanowires, with diameter distribution of 13 ($\pm$5) nm and channel length of 8.5 µm. The nanowire device of FIG. 8B contained two nanowires, 13 ($\pm$1) nm and 20 ($\pm$1) nm in diameter and a channel length of 6.3 µm. The scans were recorded at different gate voltages ranging from −5V to 5V. In both devices, by increasing $V_{DS}$, $I_{DS}$ linearly increased, followed by device saturation due to a drastic fall-off in the charge carriers (electrons). When negative gate bias was applied (lines with symbols), channel conductivity gradually disappeared. Hence the channel is n-type.

Figure 8D:
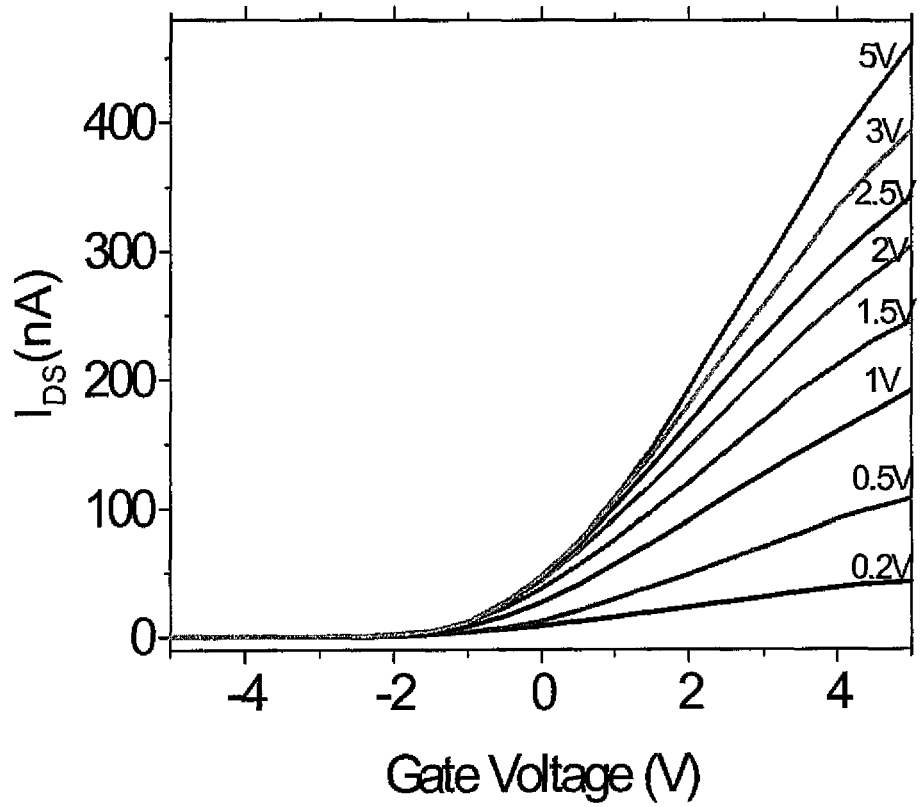
Figure 8E:
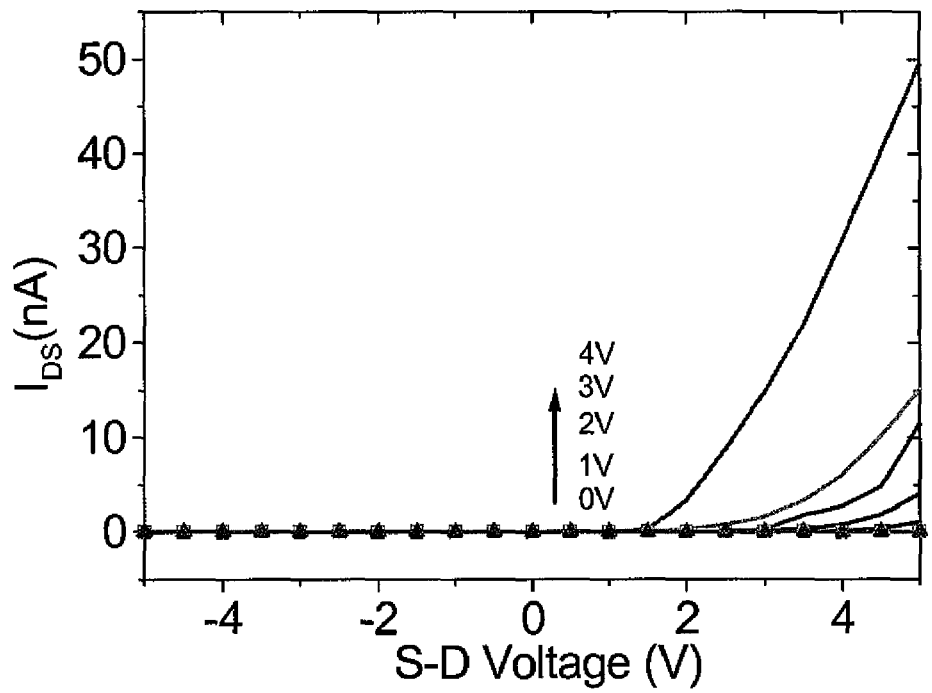

The gate modulation efficiency was further investigated by plotting $I_{DS}$-$V_G$ for a variety of source-drain voltages (FIGS. 5C and 8D). At fixed $V_{DS}$, $I_{DS}$-$V_G$ scans were collected for an eight-nanowire device (FIG. 5C) and a two-nanowire device (FIG. 5D). The absence of current saturation in this voltage range indicated low resistivity of the contacts.

For such devices the threshold voltage was found to be about −3V, an indication of a "depletion mode" FET. The field-effect mobilities for the multi-nanowire and two-nanowire devices were found to be ~15 cm$^2$/Vs and 20 cm$^2$/Vs at $V_{DS}$ of 1V. In calculating the mobility, the channel width was assumed to be the sum of the diameters of the nanowires. Although the profile of nanowires is closer to a semicircular than circular shape, for estimating the field effect mobilities, the nanowire profile was considered circular. The On/Off current ratios of the devices were found to be about 10$^5$ at VDs of 4V. This information was obtained by plotting the current-voltage in a logarithmic scale and interpolating the current to the x-axis where it reaches zero at threshold voltage.

In examining several single nanowire devices with diameters less than 20 nm, $I_{DS}$-$V_{DS}$ measurements showed both linear and rectifying behaviors. FIG. 5E shows the $I_{DS}$-$V_{DS}$ data collected at different gate biases for a nanowire with 14 ($\pm$1) nm diameter and 7.1 µm channel length. An increase in the $I_{DS}$ upon increasing the gate bias voltage can be seen. The maximum drain-current at $V_{DS}$ of 5V increased from 1 nA to about 50 nA within 0V to 5V of $V_G$. This device compared to the two-nanowire device (FIG. 5B) shows a lower drain current, which could be due to Schottky contacts and smaller nanowire diameter.

Figure 8F:
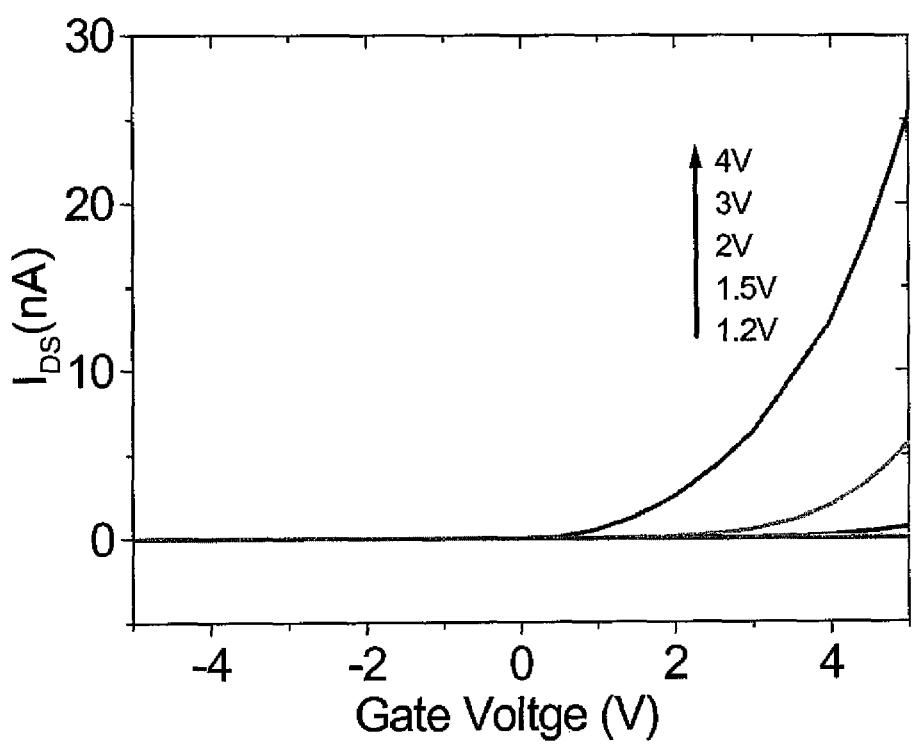

The $I_{DS}$-$V_G$ curve of FIG. 8F shows that the single nanowire device is not conducting at zero gate bias, which is different from multi-nanowire devices. The device remained off at zero gate bias indicating a very small conductive channel width. The threshold voltage was found to be about +1V, an indication that the device was in the "enhancement mode".

Among the tested devices, it was noticed that single nanowires with diameters less than 15 nm tended to remain off under no gate bias. The observation of the two different modes in multiple and single nanowire devices is likely due to a decrease in the number of nanowires and also their smaller diameter. In low power applications, a device in the "enhancement mode" is more desirable over the "depletion mode" because there is no gate voltage necessary to turn the transistor off. This is a remarkable property that can be used to tune the characteristics of a nanowire FET. The field effect electron mobility measured for several single nanowire devices was found to be 4 ($\pm$2) cm$^2$/Vs with an On/Off current ratio of at least ~5×10$^4$. It is notable that the reported values above were obtained for device lengths ranging from 4 µm to 8 µm.

Nanowire surface engineering, e.g., over-coating the nanowire with a material with suitable band gap and lattice constant, is expected to decrease the number of electron scattering sites in nanowire and therefore improve the electron mobility. An example for overcoating nanowires is an organic monolayer such as oleic acid or similar molecules. These molecules avoid surface depletion of ZnO electrons by oxygen of the atmosphere, thus improving the conductivity. Compared to ZnO thin film transistors, ZnO nanowire devices show comparable electron carrier densities (10$^{18}$ cm$^{-3}$) and field effect mobilities but significantly lower threshold voltages. In all of the fabricated devices, the threshold voltage ($V_{th}$) was found to be between about 1 to −4V originating from a gate dielectric thickness of about 60 µm. It is expected to have much lower $V_{th}$ values and improved device behavior once a high-K and structurally matched dielectric is used.

Additional advantages and modifications will readily occur to those skilled in the art. Therefore, the invention in its broader aspects is not limited to the specific details, representative devices and methods, and illustrative examples shown and described. Accordingly, departures may be made from such details without departing from the spirit or scope of the general inventive concept as defined by the appended claims and their equivalents.

What is claimed is:

1. A method of fabricating a nanowire structure, comprising:
   photolithographically depositing a nucleation center on a crystalline surface of a substrate;
   generating a nanoscale seed from the nucleation center; and
   epitaxially growing a nanowire across at least a portion of the crystalline surface starting at a nucleation site where the nanoscale seed is located.

2. The method of claim 1, wherein the substrate comprises sapphire, and the crystalline surface is formed in an α-plane (11$\bar{2}$0) or R-plane of the sapphire substrate.

3. The method of claim 1, wherein the nanowire comprises a member selected from the group consisting of zinc oxide, titanium oxide, and gallium nitride.

4. The method of claim 1, wherein the nucleation center comprises gold.

5. The method of claim 1, further comprising cleaning the crystalline surface and subjecting the crystalline surface to ozone treatment after said photolithography, yet prior to nanowire growth.

6. The method of claim 1, wherein said nanoscale seed comprises a plurality of nanoscale seeds generated from the nucleation center, and wherein the nanowire comprises a plurality of nanowires substantially simultaneously epitaxially grown from the nanoscale seeds.

7. The method of claim 1, wherein the substrate comprises a p-type substrate and the nanowire comprises an n-type nanowire that is in direct contact with the p-type substrate to create a pn junction.

8. The method of claim 1, wherein the nucleation centers have a height not greater than 25 nm.

9. A method of fabricating a nanowire structure, comprising
photolithographically depositing a nucleation center on a crystalline surface of a substrate;
generating a nanoscale seed from the nucleation center; and
epitaxially growing a nanowire across at least a portion of the crystalline surface starting at a nucleation site where the nanoscale seed is located, said epitaxially growing comprising introducing a dopant gas during growth of the nanowire for doping a portion of the nanowire with p-type dopant to create a pn junction.

10. The method of claim 9, wherein:
the substrate comprises sapphire, and the crystalline surface is formed in an α-plane ($11\bar{2}0$) of the sapphire substrate; and
the nanowires comprise zinc oxide.

11. A method of fabricating a nanodevice, comprising:
photolithographically depositing a nucleation center on a crystalline surface of a substrate;
generating a nanoscale seed from the nucleation center;
epitaxially growing a nanowire across at least a portion of the crystalline surface starting at a nucleation site where the nanoscale seed is located;
applying a first component on a first portion of the nanowire; and
applying a second component on a second portion of the nanowire, the first and second components being spaced apart from one another and connected by the nanowire.

12. The method of claim 11, wherein the substrate comprises sapphire, and the crystalline surface is formed in an α-plane ($11\bar{2}0$) or R-plane of the sapphire substrate.

13. The method of claim 11, wherein the nanowire comprises a member selected from the group consisting of zinc oxide, titanium oxide, and gallium nitride.

14. The method of claim 11, wherein the nucleation center comprises gold.

15. The method of claim 11, further comprising cleaning the crystalline surface and subjecting the crystalline surface to ozone treatment after said photolithography, yet prior to nanowire growth.

16. The method of claim 11, wherein said nanoscale seed comprises a plurality of nanoscale seeds generated from the nucleation center, and wherein the nanowire comprises a plurality of nanowires substantially simultaneously epitaxially grown from the nanoscale seeds.

17. The method of claim 11, wherein the substrate comprises a p-type substrate and the nanowire comprises an n-type nanowire that is in direct contact with the p-type substrate to create a pn junction.

18. The method of claim 11, wherein the nucleation centers have a height not greater than 25 nm.

19. The method of claim 11, wherein the first and second components comprise first and second metal electrodes, respectively.

20. The method of claim 11, wherein said epitaxially growing comprising introducing a dopant gas during growth of the nanowire for doping a portion of the nanowire with p-type dopant to create a pn junction.

* * * * *